United States Patent
Lee

(10) Patent No.: US 7,361,564 B2
(45) Date of Patent: Apr. 22, 2008

(54) METHOD OF MANUFACTURING HIGH-VOLTAGE DEVICE

(75) Inventor: Dong Kee Lee, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 121 days.

(21) Appl. No.: 11/438,992

(22) Filed: May 23, 2006

(65) Prior Publication Data

US 2007/0026618 A1    Feb. 1, 2007

(30) Foreign Application Priority Data

Jul. 26, 2005    (KR) .................. 10-2005-0067700

(51) Int. Cl.
    *H01L 21/336* (2006.01)
(52) U.S. Cl. .............. 438/301; 438/253; 438/258; 438/275; 438/286; 438/303; 438/304; 438/305

(58) Field of Classification Search ............... None
    See application file for complete search history.

(56) References Cited

U.S. PATENT DOCUMENTS 5,631,485 A * 5/1997 Wei et al. .................. 257/344
6,069,031 A * 5/2000 Wu ............................. 438/197

* cited by examiner

*Primary Examiner*—Michael Lebentritt
*Assistant Examiner*—Kyoung Lee
(74) *Attorney, Agent, or Firm*—Marshall, Gerstein & Borun LLP

(57) ABSTRACT

A method of manufacturing a high-voltage device DDD (Double Doped Drain) ion implantation process is performed at a tilt angle in order to form a smooth junction profile. Accordingly, the intensity of an electric field can be reduced and breakdown voltage margin can be secured.

11 Claims, 3 Drawing Sheets

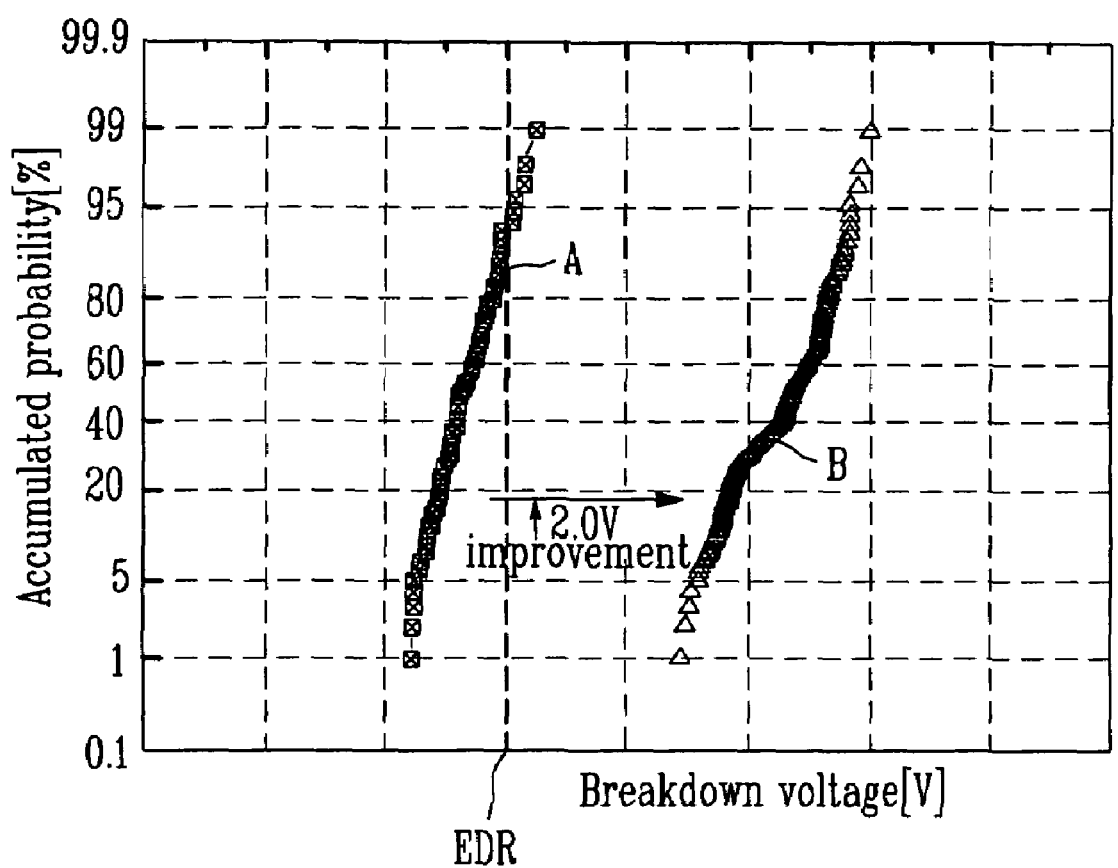

//METHOD OF MANUFACTURING HIGH-VOLTAGE DEVICE

BACKGROUND

1. Field of the Invention

The invention relates generally to a method of manufacturing a high-voltage device and, more particularly, the invention relates to a method of manufacturing a high-voltage device, wherein a junction profile inhibits reduction of the intensity of an electric field, thereby securing breakdown voltage margin.

2. Discussion of Related Art

In a NAND flash device, a high bias voltage is used upon program/erase. To apply the high bias voltage to a cell, a high voltage transistor must be disposed at the end of word lines and bit lines so that a high voltage is smoothly applied thereto. If a voltage drop occurs when a voltage is transferred to the cell in the high voltage transistor, program/erase fail may be caused due to speed delay.

In the high-voltage device of 90 nm technology NAND flash that is now mass produced, the junction profile is somewhat abrupt and it leads to a situation where the junction breakdown voltage does not fulfill EDR (Electrical Design Rule) specifications (about 90%; refer to "A" in FIG. 3).

SUMMARY OF THE INVENTION

An embodiment of the invention relates to a method of manufacturing a high-voltage device, in which the junction profile of a voltage element becomes slow to reduce the intensity of an electric field, thereby securing breakdown voltage margin.

A method of manufacturing a high-voltage device according to an embodiment of the invention includes the steps of forming an isolation layer and a gate in a semiconductor substrate, implanting a Double Doped Drain (DDD) ion at a tilt angle, forming DDD junctions having a smooth inclination, implanting a Lightly Doped Drain (LDD) ion on the entire surface, forming spacers on both sides of the gate, and forming a high concentration source and a drain junction within the DDD junction on both sides of the gate and spacers.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is a graph showing the distribution of a junction breakdown voltage value of the high-voltage device according to the related art and an embodiment of the invention.

DETAILED DESCRIPTION

Figure 1:
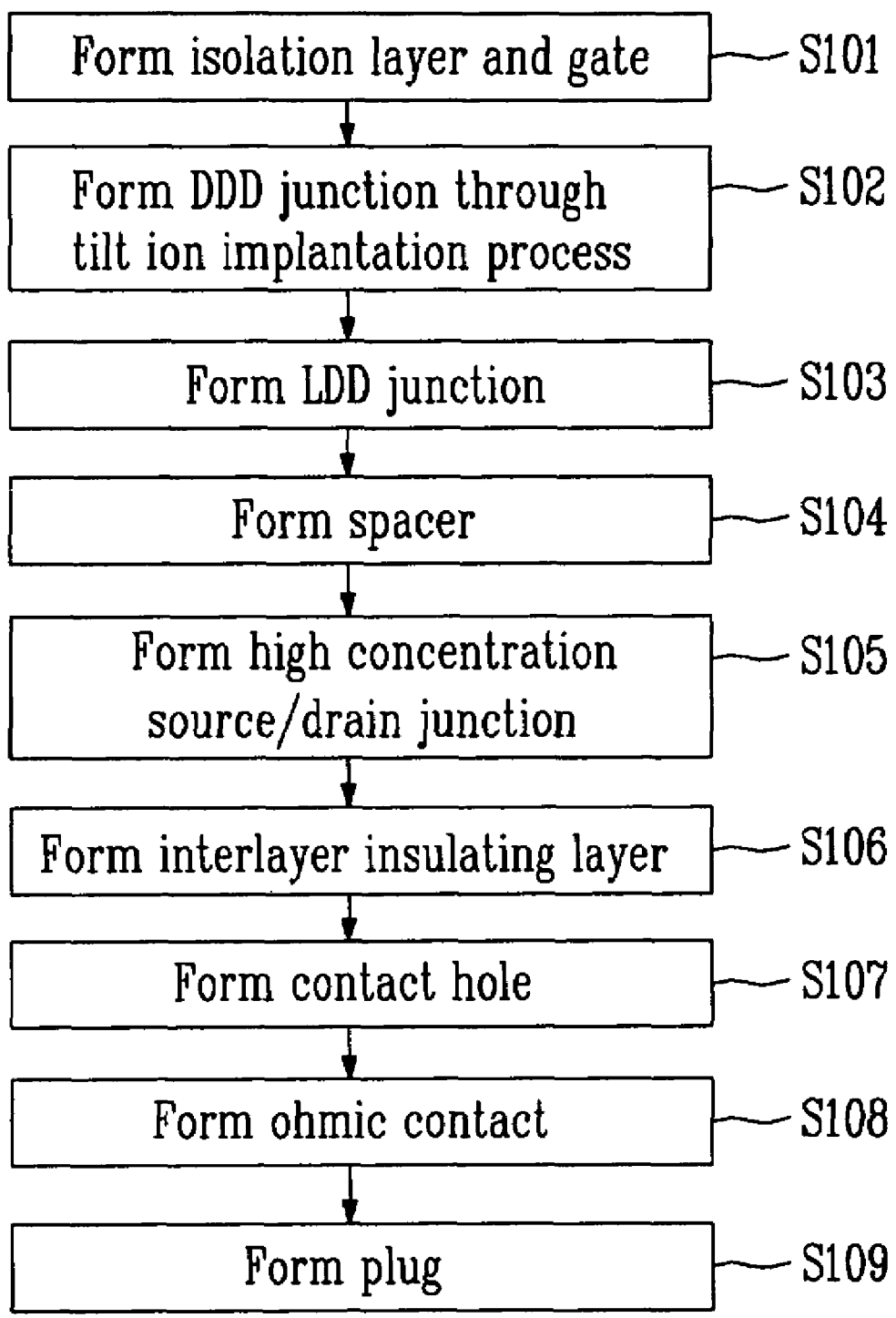
FIG. 1 is a flowchart illustrating process steps of a method of manufacturing a high-voltage device according to an embodiment of the invention.

In the following detailed description, only certain exemplary embodiments of the invention have been shown and described simply by way of illustration. As those skilled in the art will realize, the described embodiments may be modified in various different ways, all without departing from the spirit or scope of the invention. Accordingly, the drawings and description are to be regarded as illustrative in nature and not restrictive. Like reference numerals designate like elements throughout.

FIG. 1 is a flowchart illustrating process steps of a method of manufacturing a high-voltage device according to an embodiment of the invention.

An isolation process is performed to form an isolation layer. A gate oxide layer and a gate electrode are stacked to form a gate (S101). Lateral walls of the gate are reinforced by a re-oxidation process.

A DDD mask through which a high voltage NMOS transistor formation region is opened is then formed. A DDD ion implantation process using the DDD mask is performed to form DDD junctions in the semiconductor substrate on both sides of the gate formed in the high voltage NMOS transistor formation region. At this time, when injecting a DDD ion, a tilt ion is injected so that the DDD junctions have a smooth profile and overlap between the gate and the DDD junctions can be enhanced (S102).

In the related art, when implanting a DDD ion, a process employing a tilt angle of 0° was performed. In an embodiment of the invention, however, a process employing a tilt angle of 3° to 7° is performed so that the DDD junctions have a smooth profile and the overlap between the gate and DDD junctions can be strengthened. In addition, a DDD ion is injected along the gate while changing the tilt direction such that overlap between the gate and DDD junctions can be strengthened and a smooth DDD junction profile can be formed in all directions.

Upon injection of the DDD ion, $P_{31}$ may be used as a source ion. In this case, the concentration of the $P_{31}$ ion is set to 5.0E11 ions/cm$^3$ to 1.05E12 ions/cm$^3$ and ion implantation energy is set to 50 KeV to 80 KeV.

Thereafter, $P_{31}$ ions and $As_{75}$ ions are sequentially injected by a blanket ion implantation process, thus forming a DDD junction (S103).

The junction of the high voltage NMOS transistor formed as described above undergoes a total of three ion implantation processes including one DDD ion implantation process and two LDD ion implantation processes. The junction structure is called TDD (Triple Diffused Drain).

Thereafter, an insulating layer is deposited on the entire structure and is then etched back to form spacers on both sides of the gate (S104). The target of the etch-back process is performed so that a remaining thickness of the gate oxide layer is 300 Å or more.

To prevent the attack of the semiconductor substrate depending on the injection of the high concentration impurity ions, a buffer oxide layer is formed on the entire surface. The thickness of the buffer oxide layer may be set considering the attack depending on the implantation of the high concentration impurity ion. For example, the buffer oxide layer can be formed to a thickness of 50 Å to 150 Å.

A high concentration impurity ion is implanted using the high concentration impurity ion implantation mask, forming high concentration source/drain junctions in the semiconductor substrate on both sides of the gate and spacer (S105).

The high concentration impurity ion implantation mask is stripped and a cleaning process is then carried out.

In the related art, BOE (Buffer Oxide Etchant) diluted at a ratio of 300:1 was used in the cleaning process. Accordingly, in the cleaning process using BOE, the buffer oxide layer is lost. In an embodiment of the invention, however, the cleaning process is performed using a mixed solution of SPM ($H_2SO_4+H_2O_2$) and APM ($NH_4OH+H_2O_2+H_2O$).

A stopper oxide layer and a stopper nitride layer, which serve as an etch stopper in a subsequent contact etch process, are then formed on the entire surface. An interlayer insulating layer is then formed on the entire surface (S106).

The interlayer insulating layer, the stopper nitride layer, and the stopper oxide layer are etched by a contact etch process, forming a contact hole through which the high concentration source/drain junction is exposed (S107).

To secure a contact resistance characteristic, a plug ion is implanted using the plug mask under the conditions of low energy and a high concentration, thereby forming an ohmic contact under the contact hole (S108).

$P_{31}$ ion may be used as the plug ion. To secure ohmic resistance, the ion implantation energy may be set to 5 KeV to 20 KeV, the tilt angle may be set to 0° and the dose may be set to 5E14 ions/cm$^3$ to 2E15 ions/cm$^3$. The ohmic contact is formed in a thin thickness in order to improve the junction breakdown voltage.

Thereafter, to activate the implanted plug ion, an annealing process of a RTA (Rapid Thermal Anneal) method is carried out under a nitrogen ($N_2$) gas atmosphere of about 1000° C. A temperature ramp-up ratio of the annealing may be set to 200° C. to 250° C./sec and an annealing process time may be set to 30 to 60 minutes.

A plug is then formed within the contact hole (S109). A protection layer is formed on the entire surface including the plug.

The fabrication of the high-voltage device according to an embodiment of the invention is thereby completed.

Figure 2A:
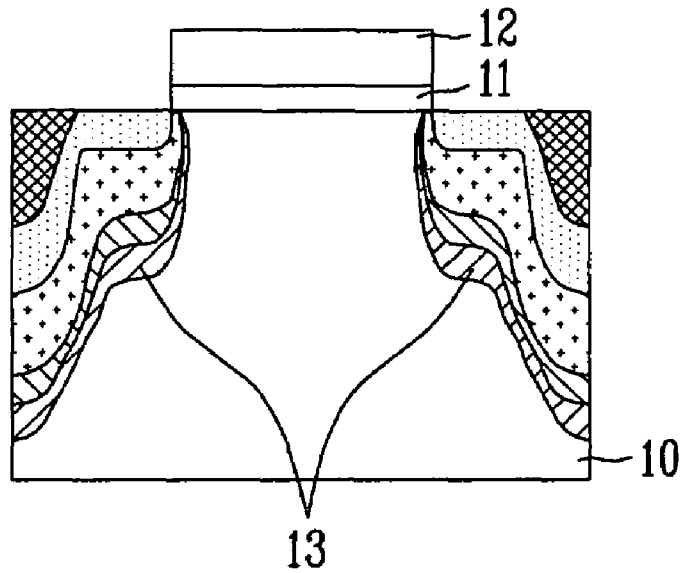
FIG. 2 is a view for comparing a junction profile structure of the high-voltage device according to the related art and an embodiment of the invention.
Figure 2B:
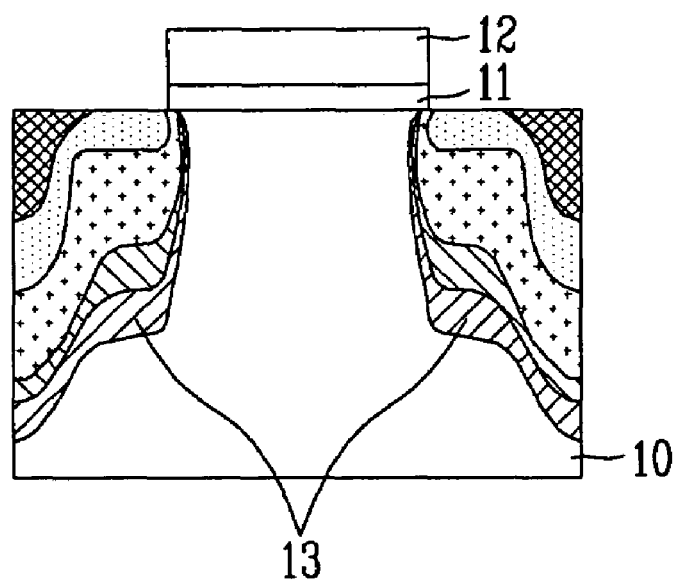

FIG. 2 is an illustration comparing a junction profile structure of the high-voltage device according to the related art and an embodiment of the invention. FIG. 2(A) shows a cross-sectional profile of the high-voltage device in the related art and FIG. 2(B) shows cross-sectional profile of the high-voltage device according to an embodiment of the invention.

Reference numeral 10 designates the semiconductor substrate, 11 indicates the gate oxide layer, 12 indicates the gate electrode and 13 indicates the source and drain junctions.

From FIGS. 2(A) and 2(B), it can be seen that as the DDD ion is implanted at a tilt, the source and drain junctions 13 in the present embodiment have a smooth profile in comparison with that of the related art.

FIG. 3 is a graph showing the distribution of a junction breakdown voltage value of the high-voltage device according to the related art and an embodiment of the invention. A indicates the related art and B indicates an embodiment of the invention.

In the case where the related art is applied, a case where the junction breakdown voltage does not satisfy the EDR specifications is 90%. In the case where an embodiment of the invention is applied, however, the junction breakdown voltage is improved 2V on average and the EDR specification is satisfied accordingly.

As described above, according to the invention, a junction profile is smoothly formed to reduce the intensity of an electric field. Therefore, the invention is advantageous in that it can secure breakdown voltage margin.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a high-voltage device, the method comprising the steps of:
    forming an isolation layer and a gate in a semiconductor substrate;
    implanting a Double Doped Drain (DDD) ion at a tilt angle, and forming DDD junctions having a smooth inclination;
    implanting a (Lightly Doped Drain) LDD ion on the entire surface;
    forming spacers on both sides of the gate; and
    forming high concentration source drain junctions within the DDD junction on both sides of the gate and spacers.

2. The method of claim 1, wherein the tilt angle is in the range of 3° to 7°.

3. The method of claim 1, further comprising the step of forming a buffer oxide layer on the entire surface after forming the spacers.

4. The method of claim 3, comprising forming the buffer oxide layer to a thickness of 50 Å to 150 Å.

5. The method of claim 1, further comprising the steps of:
    after forming the high concentration source drain junction, performing a cleaning process;
    forming a stopper oxide layer and a stopper nitride layer on the entire surface;
    forming an interlayer insulating layer on the entire surface;
    forming a contact hole through which the high concentration source and drain junction are exposed in the interlayer insulating layer;
    forming an ohmic contact in the semiconductor substrate under the contact hole; and
    forming a plug within the contact hole.

6. The method of claim 5, comprising using a mixed solution of SPM ($H_2SO_4+H_2O_2$) and APM ($NH_4OH+H_2O_2+H_2O$) in the cleaning process.

7. The method of claim 5, comprising forming the stopper oxide layer to a thickness of 50 Å to 200 Å.

8. The method of claim 5, comprising forming the ohmic contact by implanting plug ions under the contact hole.

9. The method of claim 8, comprising using $P_{31}$ ion as the plug ion, using an ion implantation energy of 5 KeV to 20 KeV, using a tilt angle of 0°, and using an ion dose of 5E14 ions/cm$^3$ to 2E15 ions/cm$^3$.

10. The method of claim 8, further comprising the step of performing a rapid thermal annealing process under a nitrogen gas atmosphere in order to activate the plug ion after implanting the plug ion.

11. The method as claimed in claim 10, comprising using a temperature of 1000° C., an annealing time of 30 minutes to 60 minutes, and a ramp-up ratio of 200° C./sec to 250° C./sec in the rapid thermal annealing process.

* * * * *